United States Patent

Chen

(10) Patent No.: US 6,525,926 B1
(45) Date of Patent: Feb. 25, 2003

(54) MULTINODE HIGH DENSITY COMPUTING APPARATUS

(75) Inventor: Steven Chen, Fremont, CA (US)

(73) Assignee: Racklogic Technologies, Inc., Fremont, CA (US)

( * ) Notice: Subject to any disclaimer, the term of this patent is extended or adjusted under 35 U.S.C. 154(b) by 0 days.

(21) Appl. No.: 09/613,384

(22) Filed: Jul. 11, 2000

(51) Int. Cl.[7] .............................. H05K 5/02; H05K 7/18; H05K 7/10

(52) U.S. Cl. ..................... 361/683; 361/686; 361/725; 361/731; 312/223.2

(58) Field of Search ............................... 361/679–686, 361/724–731, 736, 748, 752; 312/223.1, 223.2

(56) References Cited

U.S. PATENT DOCUMENTS

| | | |
|---|---|---|
| 3,188,524 A | 6/1965 | Williams |
| 3,711,814 A | 1/1973 | Pomella et al. |
| 3,775,643 A | 11/1973 | Schachnow et al. |
| 3,853,379 A | 12/1974 | Goodman et al. |
| 3,950,057 A | 4/1976 | Calabro |
| 4,022,326 A | 5/1977 | Marconi |
| 4,109,300 A | 8/1978 | Reimer |
| 4,614,383 A | 9/1986 | Polley et al. |
| 4,672,535 A * | 6/1987 | Katzan et al. ............... 364/200 |
| 5,216,579 A * | 6/1993 | Basara et al. ............... 361/383 |
| 5,347,430 A | 9/1994 | Curlee et al. |
| 5,348,482 A | 9/1994 | Rudy, Jr. et al. |
| 5,388,032 A | 2/1995 | Gill et al. |
| 5,390,081 A | 2/1995 | St. Pierre |
| 5,392,192 A | 2/1995 | Dunn et al. |
| 5,460,441 A * | 10/1995 | Hastings et al. ............ 312/298 |
| 5,571,256 A * | 11/1996 | Good et al. .................... 211/26 |
| 5,623,594 A | 4/1997 | Swamy |
| 5,636,341 A * | 6/1997 | Matsushita et al. ..... 395/182.11 |
| 5,666,271 A | 9/1997 | Kim et al. |
| 5,680,536 A | 10/1997 | Tyuluman |
| 5,684,271 A | 11/1997 | Scholder et al. |
| 5,684,671 A * | 11/1997 | Hobbs et al. ................ 361/683 |
| 5,691,504 A | 11/1997 | Sands et al. |
| 5,699,500 A | 12/1997 | Dasgupta |
| 5,726,866 A * | 3/1998 | Allen .......................... 361/816 |
| 5,761,033 A | 6/1998 | Wilhelm |
| 5,761,043 A | 6/1998 | Salmonson |
| 5,801,921 A * | 9/1998 | Miller ......................... 361/686 |
| 5,825,615 A | 10/1998 | Ohara |
| 5,868,585 A | 2/1999 | Barthel et al. |
| 5,892,662 A | 4/1999 | Verma |
| 5,959,841 A * | 9/1999 | Allen et al. .................. 361/725 |
| 6,008,995 A | 12/1999 | Pusateri et al. |
| 6,025,989 A * | 2/2000 | Ayd et al. .................... 361/695 |
| 6,038,138 A | 3/2000 | Dayton et al. |
| 6,175,490 B1 * | 1/2001 | Papa et al. ................... 361/686 |
| 6,259,605 B1 * | 7/2001 | Schmitt ....................... 361/727 |

* cited by examiner

*Primary Examiner*—Anatoly Vortman
(74) *Attorney, Agent, or Firm*—Knoble & Yoshida, LLC

(57) ABSTRACT

A modular multinode computing apparatus includes a rack mountable enclosure and more than one system board that is secured within the enclosure in a high density configuration that is preferably configured so that the system boards are positioned in substantially the same plane, which is also the plane in which the apparatus resides when mounted within a rack. The enclosure preferably has four system boards, and is sized as a 1 u form factor. When mounted in a rack with like units, the apparatus permits a data center or computing cluster to be fabricated that has a processing density that is much greater than conventional clusters that are configured with 1 u based single node units.

44 Claims, 3 Drawing Sheets

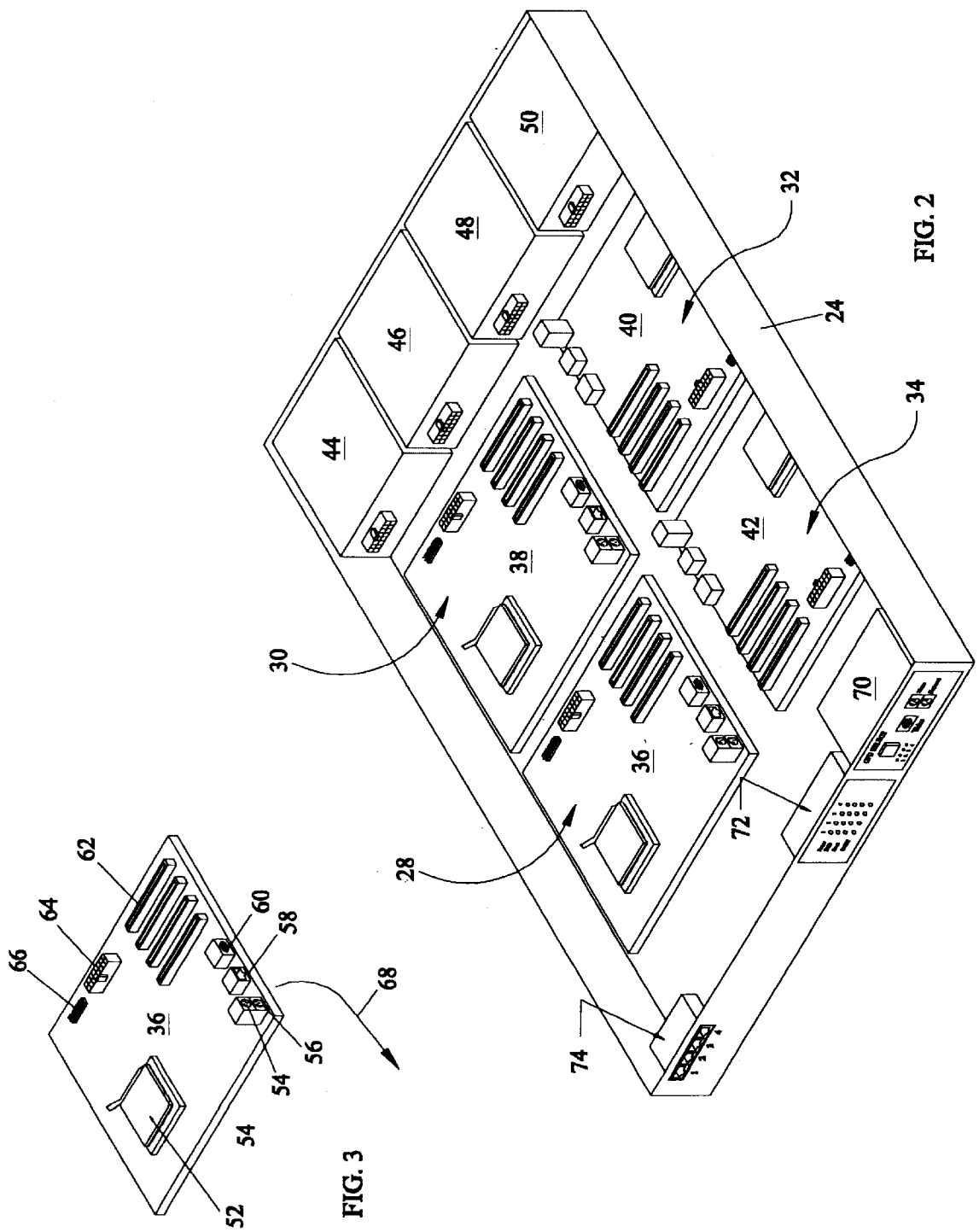

MULTINODE HIGH DENSITY COMPUTING APPARATUS

BACKGROUND OF THE INVENTION

1. Field of the Invention

This invention relates broadly to the field of electronic computation, and more specifically to an improved multinode high density computing apparatus that may be utilized in a rack-mounted configuration or as a standalone unit.

2. Description of the Related Technology

Enterprise data centers such as large-scale corporate intranets and Internet servers often need to be located in urban or other expensive locations, because this is where broadband Internet access tends to be available. The administrators of such facilities are often allocated less space than would be ideal for their needs, and often rapidly outgrow the allocated space even if it is initially sufficient. As a result, a demand has developed in recent years for high density computing systems that will provide the requisite computing power, but will occupy a minimum of space. In addition to space constraints, system administrators demand price competitiveness from their vendors, along with reliability, availability and ease of maintenance.

Hardware manufacturers have responded to this demand by mounting server machines in racks that are configured according to the RETMA or EIA RS-310 standard, which provides mounting structure that is vertically spaced in increments commonly referred to as "retmas" or "u's," each of which is about 1.75 inches or 44.45 millimeters. A typical rack may have a 42 u vertical dimension, and this space may be occupied by components such as computing nodes, monitoring equipment and storage hardware. IBM for example offers a number of rack mounted products, such as the Netfinity™ 4000R server, which has a 1 u form factor, and its Netfinity™ EXP15 storage units, which have a form factor of 3 u. Other hardware manufacturer have similar, competitive products. Single node modular units such as the 4000R™ have utility as so-called appliance servers, which are integrated software and hardware solutions that are designed for a dedicated service, such as web-hosting, caching, or firewall applications. Appliances are designed as turnkey solutions and are emerging as viable alternatives to general-purpose servers.

The term "node" in the lexicon the industry means a discrete computer, which has a single system board having at least one CPU. In typical multinode parallel processing computing environments system integrators mount multiple computers or nodes such as the IBM 4000R™ in a single rack. Despite the flexibility and density advantages of the rack configuration and the growing number of server nodes having a 1 u form factor, the available space in many instances remains inadequate for the task at hand. This is exacerbated by the space requirements for the necessary video/monitors, keyboard access and mouse access for each of the nodes, and for networking access to each node.

Multinode systems have been produced using so-called passive backplane architecture, using enclosures that have form factors of 3 u or more. Unfortunately, the need for vertical space in such systems is prohibitive of achieving true high-density configuration.

A need exists for an improved multinode high density computing apparatus that enables rack mountable solutions that are of higher computing density than have heretofore been available, and that is further relatively inexpensive.

SUMMARY OF THE INVENTION

Accordingly, it is an object of the invention to provide an improved multinode high density computing apparatus that enables rack mountable solutions that are of higher computing density than have heretofore been available, and that is further relatively inexpensive.

In order to achieve the above and other objects of the invention, a modular multinode computing apparatus according to a first aspect of the invention includes a rack mountable enclosure; more than one system board secured within the enclosure in a high density configuration, each of the system boards constituting a separate computing node; and connecting structure provided on the enclosure for accessing the computing nodes.

According to a second aspect of the invention, a modular multinode computing apparatus includes a rack mountable enclosure, more than one computing node secured within the enclosure in a high density configuration; and connecting structure provided on the enclosure for accessing the computing nodes.

A multinode computing apparatus according to a third aspect of the invention includes an enclosure; more than one computing node secured within the enclosure in a high density configuration that has a form factor of no more than 2 u; and connecting structure provided on the enclosure for accessing the computing nodes.

According to a fourth aspect of the invention, a multinode computing apparatus includes an enclosure; more than one computing node secured within the enclosure in a high density configuration so that more than one of the computing nodes are positioned in substantially the same plane; and connecting structure provided on the enclosure for accessing the computing nodes.

A multinode computing apparatus according to a fifth aspect of the invention includes an enclosure; more than one computing node secured within the enclosure in a high density configuration; more than one power supply positioned within the enclosure, each of the power supplies being dedicated to one of the computing nodes; and connecting structure provided on the enclosure for accessing the computing nodes.

These and various other advantages and features of novelty that characterize the invention are pointed out with particularity in the claims annexed hereto and forming a part hereof However, for a better understanding of the invention, its advantages, and the objects obtained by its use, reference should be made to the drawings which form a further part hereof, and to the accompanying descriptive matter, in which there is illustrated and described a preferred embodiment of the invention.

BRIEF DESCRIPTION OF THE DRAWINGS

FIG. 2 is a cutaway perspective view of a multinode computing apparatus according to a preferred embodiment that is one of the components of the system that is depicted in FIG. 1;

FIG. 3 is a perspective view of one of the subcomponents and the apparatus that is depicted in FIG. 2;

DETAILED DESCRIPTION OF THE PREFERRED EMBODIMENT(S)

Figure 1:
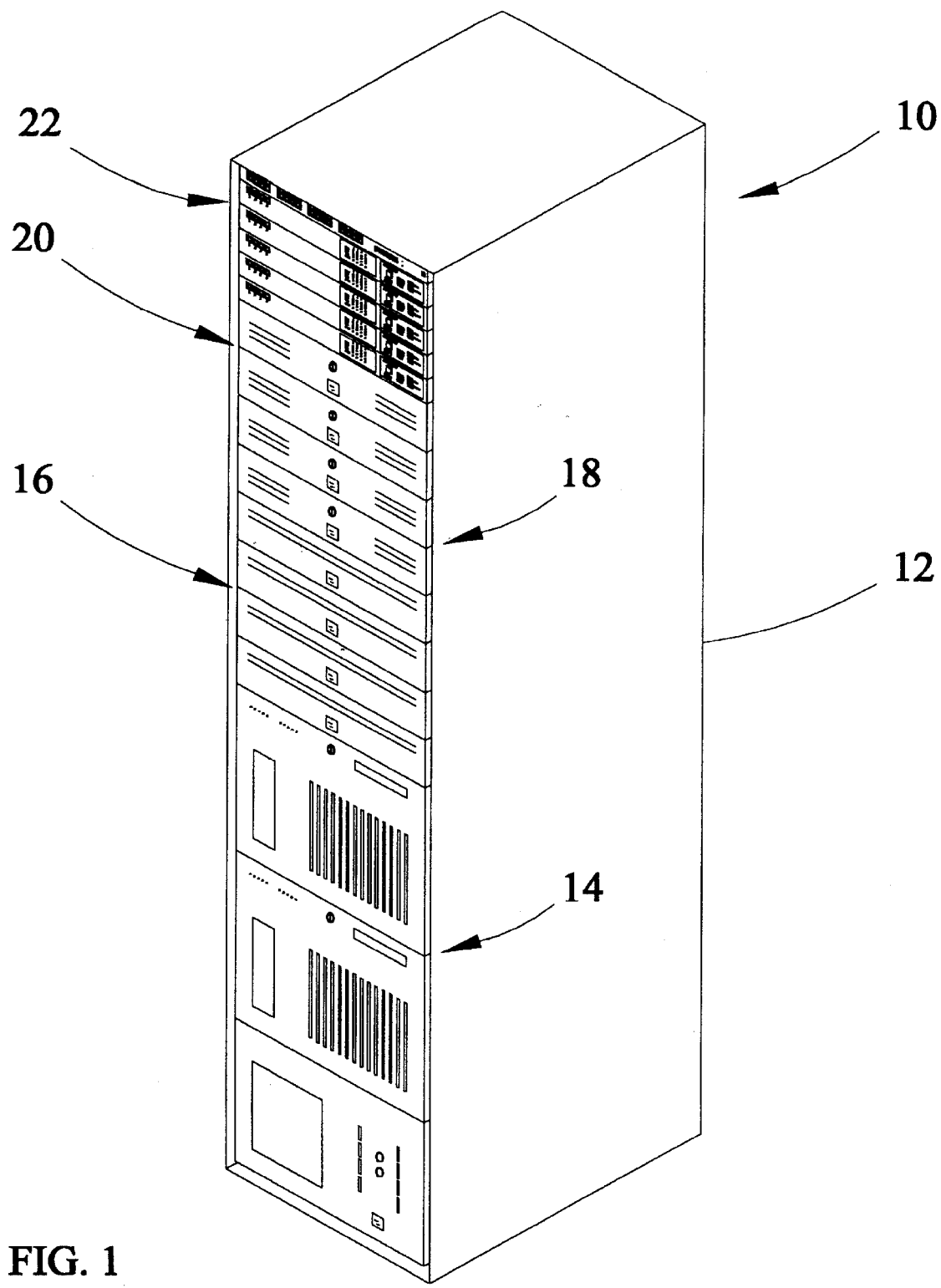
FIG. 1 is a front elevational view of a high density computing system that is constructed according to a preferred embodiment of the invention.

Referring now to the drawings, wherein like reference numerals designate corresponding structure throughout the views, and referring in particular to FIG. 1, a high-density computing system 10 that is constructed according to a preferred embodiment of the invention includes a rack 12 that is constructed according to the industry standard RETMA or EIA RS-310 specification. The system 10 is in this particular configuration shown to include a number of different rack mountable components such as a pair of 7 u database servers 14, four different application servers 16 each of which have a form factor of 2 u, two e-mail servers 18 each having a 2 u form factor, two web servers 20 each also having a form factor of 2 u, and, advantageously, a plurality of multinode computing apparatuses 22 that are provided to provide a higher density configuration in a form factor of 1 u or 2 u than has heretofore been thought possible. A 6 u uninterruptible power supply is also provided at the bottom of the rack 12.

Referring now to FIG. 2, which is a cutaway perspective view of one of the multinode computing apparatuses 22, it will be seen that the apparatus 22 includes more than one computing node within a single enclosure 24 that has a form factor of no more than 2 u, and in the preferred embodiment of 1 u and is provided with the mounting hardware 26 that is necessary to mount the enclosure 24 to the rack 12. Specifically, four different computing nodes 28, 30, 32, 34 are provided within the enclosure 24 of the apparatus 22, each of the respective computing nodes having a system board 36, 38, 40, 42. Also provided within the enclosure 24 are a plurality of power supplies, which in the preferred embodiment include a first power supply 44 that is dedicated to the first node 28, a second power supply 46 that is dedicated to the second node 38, a third power supply 48 that is dedicated to the third node 40, and a fourth power supply 50 that is dedicated to the fourth node 42. Similarly, the four computing nodes 28, 30, 32, 34 are each preferably provided with a hard drive 76, 78, 80, 82 on the respective system board 36, 38, 40, 42, as is best shown in the schematic diagram that is provided as FIG. 4.

Alternatively, each node could be packaged in its own box, with the separate boxes being secured together into a common enclosure.

FIG. 3 is a more detailed view of one of the system boards 36 that are depicted in FIG. 2. As may be seen in FIG. 3, the system board 36 it is preferably provided with at least one CPU 52, which in the preferred embodiment is Intel Pentium class processor such as a Pentium III or Celeron, or AMD K6 processor, but could alternatively be any one a number of different processors that are manufactured by anyone of number of different manufacturers. Preferably the system boards are provided with a CPU mounting socket that is based on the Intel socket 370 specification or the AMD Socket 7 or Socket A specification.

In an alternative embodiment wherein the enclosure is constructed as a 2 u form factor, the system boards are provided with an AMD Slot A mounting socket, and an AMD Athlon class processor. The slot-type CPU mounting structure is vertically oriented, thereby requiring a minimum of 2 u of vertical space.

Each system board including system board 36 further includes a keyboard connector 54, a mouse connector 56, a networking connector 58 and a video/monitor connector 60. The connectors 54, 56, 58, 60 are preferably located on a common edge of the system board 36 that is preferably an interior edge and have a common axial orientation, so that all four connectors may be engaged by proprietary cabling 68 that includes complementary individual connectors that are pre-spaced and oriented at the terminus of the proprietary cabling 68 to be able to engage the connectors 54, 56, 58, 60 in a single step, and also preferably the auxiliary connector 66. Alternatively, commercially available nonproprietary cabling may be used. The cabling is shown schematically in FIG. 4.

System board 36 further includes a plurality of expansion slots 62, which may have the standard PCI or ISA configuration, and further has an ATX power connector 64 and a number of auxiliary connectors 66. Although in the embodiment having the 1 u form factor there will not be enough vertical room to accommodate a full expansion card, other connection structure, such as ribbon type connectors that are configured to mate with the expansion slots or riser type connectors may be employed. The power connector 64 is of course connected to the corresponding power supply 44 by a standard cable, which has been omitted from FIGS. 2 and 3 for the purpose of clarity.

As is further shown in FIG. 3, the multinode computing apparatus 22 further includes an electronic KVM switching apparatus 70 that permits selective monitoring and control of any one of the four nodes 28, 30, 32, 34 at any one time. The cabling 68 from each of the system boards 36, 38, 40, 42 leads into the KVM switching apparatus 70. The actual cabling may be done via the auxiliary control and display module 72. A system select switch 71 is provided on the apparatus 70 so as to be accessible from the exterior of the enclosure 24, as shown in FIG. 3. In addition, the apparatus 70 has a standard keyboard connector 86, a VGA monitor connector 88 and a mouse connector 90 on the face that is accessible from the exterior of the enclosure 24. By depressing the system select switch 71, a system administrator or other individual will be able to toggle between the different nodes 28, 30, 32, 34 for monitoring and control purposes, without having to physically connect and disconnect the keyboard, monitor, and mouse cabling. The apparatus 70 is of the type that is commercially available from a number of different vendors, such as Belkin Components' Belkin® Omni Cube™ 4-Port, Part number F1D094, Cybex's Cybex® SwitchView™ 4-Port, Part number 12045, or Raritan's Raritan® SwitchMan™ 4-Port, Part number SW4.

Figure 4:
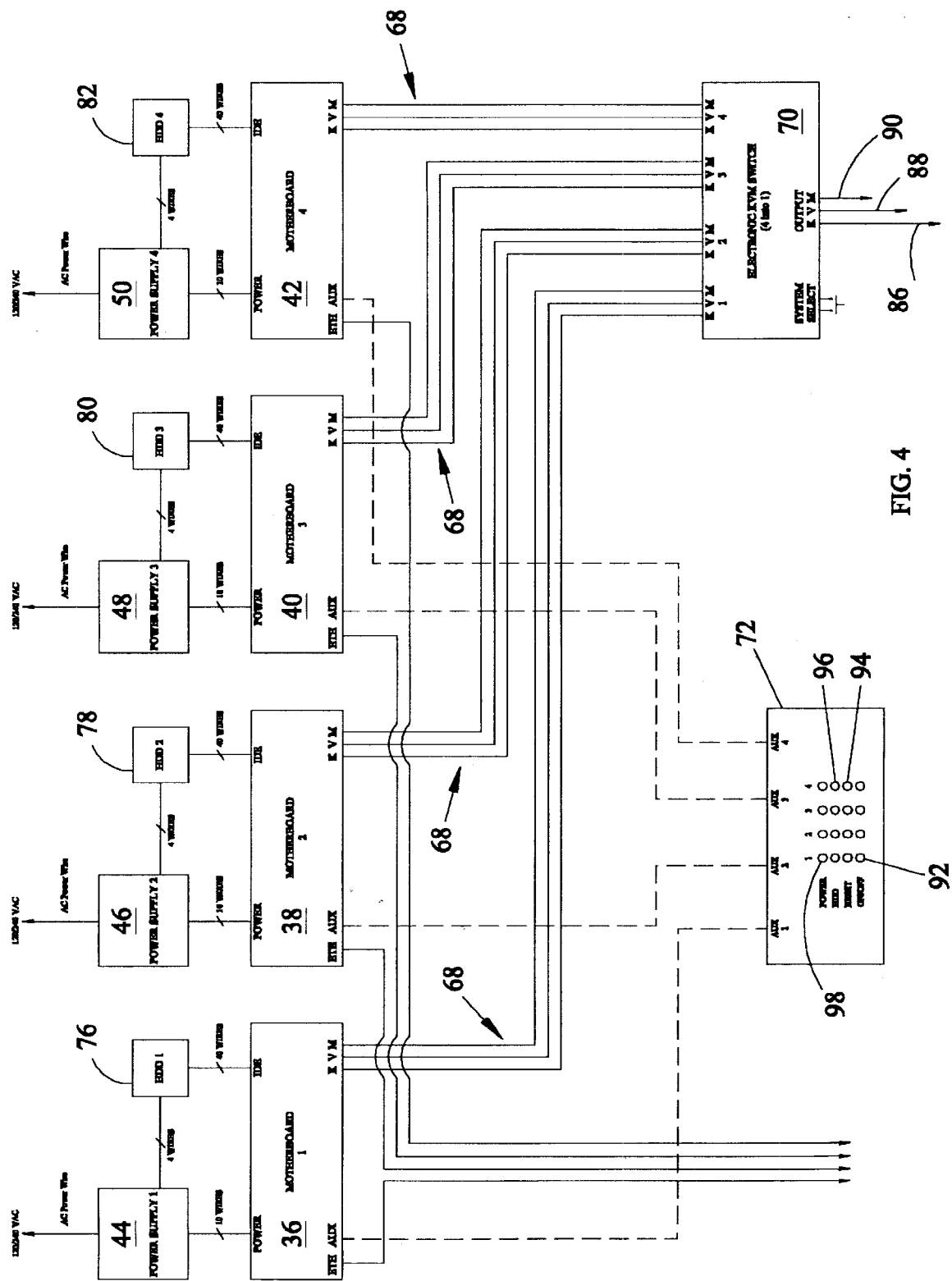
FIG. 4 is a schematic diagram depicting the electronic interconnection of the components of the apparatus that is illustrated in FIG. 2.

Also provided on an exterior surface of the enclosure 24 that will be visible to a viewer when the multinode computing apparatus 22 is positioned in a rack 12 is an auxiliary control and display module 72 that preferably includes, as is best shown in FIG. 4, on/off switches 92 for each of the nodes 28, 30, 32, 34, reset switches 94 also for each of the nodes, hard drive activity indicators 96, which are preferably LEDs, for each of the nodes, and power indicators 98, which are also preferably LEDs, for each of the nodes. According to the preferred embodiment of the invention, both the on/off switches 92 and the reset switches 94 are recessed so that will not accidentally be depressed. In addition, an Ethernet port access module 74 is provided on the exterior surface of the enclosure 24 for providing networking access to each of the computing nodes 28, 30, 32, 34. It should be understood that alternative indicator types, controls and arrangements could be provided that would be equally within the scope of the invention.

According to one important aspect of the invention, the computing nodes 28, 30, 32, 34 are positioned within the enclosure 24 of the multinode computing apparatus 22 so that their system boards 36, 38, 40, 42 are positioned within substantially the same plane. This plane is preferably substantially parallel to the mounting plane of the rack mountable enclosure 24, which is the plane in which the enclosure 24 is inserted and withdrawn from the rack 12 shown in FIG. 1. Also, when viewed from above, the system boards are arranged so that at least two of the system boards are juxtaposed so that an edge of one of the system boards is positioned next to and is substantially parallel and substantially aligned with a an opposing edge of the other system board. In the preferred embodiment, the four system boards 36, 38, 40, 42 are substantially juxtaposed with respect to each other, and are arranged together generally to form a square or rectangular area.

It is to be understood, however, that even though numerous characteristics and advantages of the present invention have been set forth in the foregoing description, together with details of the structure and function of the invention, the disclosure is illustrative only, and changes may be made in detail, especially in matters of shape, size and arrangement of parts within the principles of the invention to the full extent indicated by the broad general meaning of the terms in which the appended claims are expressed.

What is claimed is:

1. A modular multinode computing apparatus, comprising:
    a rack mountable enclosure;
    more than one system board secured within said enclosure in a high density configuration, each of said system boards constituting a separate computing node and being secured within said enclosure so that more than one of said system boards are positioned in substantially the same plane; and
    connecting means provided on said enclosure for accessing said computing nodes.

2. An apparatus according to claim 1, wherein said rack mountable enclosure has a form factor of no more than 2 u.

3. An apparatus according to claim 1, wherein said rack mountable enclosure has a form factor of no more than 1 u.

4. An apparatus according to claim 1, wherein said connecting means comprises more than one networking connector, each of said connectors being in communication with one of said system boards.

5. An apparatus according to claim 1, further comprising more than one power switch on an exterior of said enclosure, each of said power switches being connected to one of said system boards.

6. An apparatus according to claim 1, further comprising more than one power supply positioned within said enclosure, each of said power supplies being dedicated to one of said system boards.

7. An apparatus according to claim 1, wherein four system boards are secured in said enclosure, and wherein all four of said system boards are positioned in substantially the same plane.

8. An apparatus according to claim 1, wherein said plane is substantially parallel to a mounting plane of said rack mountable enclosure.

9. An apparatus according to claim 1, further comprising more than one power supply positioned within said enclosure, each of said power supplies being dedicated to one of said system boards.

10. An apparatus according to claim 1, wherein said a rack mountable enclosure has a form factor of no more than 2 u.

11. An apparatus according to claim 10, wherein said a rack mountable enclosure has a form factor of no more than 1 u.

12. An apparatus according to claim 1, wherein said connecting means comprises a keyboard connector.

13. An apparatus according to claim 1, wherein said connecting means comprises a video connector.

14. An apparatus according to claim 1, wherein said connecting means comprises a mouse connector.

15. A modular multinode computing apparatus, comprising:
    a rack mountable enclosure;
    more than one system board secured within said enclosure in a high density configuration, each of said system boards constituting a separate computing node;
    connecting means provided on said enclosure for accessing said computing nodes; and
    more than one system status indicator located on an exterior portion of said enclosure, each of said system status indicators being connected to one of said system boards for indicating a status of said system board.

16. An apparatus according to claim 15, wherein at least one of said system status indicators comprises a power status indicator.

17. An apparatus according to claim 15, wherein at least one of said system status indicators comprises a hard drive activity indicator.

18. An apparatus according to claim 15, wherein at least one of said system status indicators comprises a network activity status indicator.

19. A modular multinode computing apparatus, comprising:
    a rack mountable enclosure;
    more than one computing node secured within said enclosure in a high density configuration, said computing nodes being secured within said enclosure so that more than one of said computing nodes are positioned in substantially the same plane; and
    connecting means provided on said enclosure for accessing said computing nodes.

20. An apparatus according to claim 19, wherein said rack mountable enclosure has a form factor of no more than 2 u.

21. An apparatus according to claim 19, wherein said rack mountable enclosure has a form factor of no more than 1 u.

22. An apparatus according to claim 19, wherein four computing nodes are secured in said enclosure, and wherein all four of said computing nodes are positioned in substantially the same plane.

23. An apparatus according to claim 19, wherein said plane is substantially parallel to a mounting plane of said rack mountable enclosure.

24. An apparatus according to claim 19, further comprising more than one power supply positioned within said enclosure, each of said power supplies being dedicated to one of said computing nodes.

25. An apparatus according to claim 19, wherein said a rack mountable enclosure has a form factor of no more than 2 u.

26. An apparatus according to claim 25, wherein said a rack mountable enclosure has a form factor of no more than 1 u.

27. An apparatus according to claim 19, wherein said connecting means comprises a keyboard connector.

28. An apparatus according to claim 19, wherein said connecting means comprises a video connector.

29. An apparatus according to claim 19, wherein said connecting means comprises a mouse connector.

30. An apparatus according to claim 19, wherein said connecting means comprises more than one networking connector, each of said connectors being in communication with one of said computing nodes.

31. An apparatus according to claim 19, further comprising more than one power supply positioned within said enclosure, each of said power supplies being dedicated to one of said computing nodes.

32. A modular multinode computing apparatus, comprising:

a rack mountable enclosure;

more than one computing node secured within said enclosure in a high density configuration;

connecting means provided on said enclosure for accessing said computing nodes; and more than one system status indicator located on an exterior portion of said enclosure, each of said system status indicators being connected to one of said computing nodes for indicating a status of said computing node.

33. An apparatus according to claim 32, wherein at least one of said system status indicators comprises a power status indicator.

34. An apparatus according to claim 32, wherein at least one of said system status indicators comprises a hard drive activity indicator.

35. An apparatus according to claim 32, wherein at least one of said system status indicators comprises a network activity status indicator.

36. An apparatus according to claim 19, further comprising more than one power switch on an exterior of said enclosure, each of said power switches being connected to one of said computing nodes.

37. A multinode computing apparatus, comprising:

an enclosure;

more than one computing node secured within said enclosure in a high density configuration that has a form factor of no more than 2 u and so that more than one of said computing nodes are positioned in substantially the same plane; and connecting means provided on said enclosure for accessing said computing nodes.

38. An apparatus according to claim 37, wherein said enclosure has a form factor of no more than 1 u.

39. An apparatus according to claim 37, wherein four computing nodes are secured in said enclosure, and wherein all four of said computing nodes are positioned in substantially the same plane.

40. An apparatus according to claim 37, further comprising more than one power supply positioned within said enclosure, each of said power supplies being dedicated to one of said computing nodes.

41. A multinode computing apparatus, comprising:

an enclosure;

more than one computing node secured within said enclosure in a high density configuration that has a form factor of no more than 2 u; and connecting means provided on said enclosure for accessing said computing nodes, said connecting means comprising a common connector for accessing more than one of said computing nodes and switching means for associating said connector with a selected one of said computing nodes.

42. An apparatus according to claim 41, wherein said connecting means comprises more than one networking connector, each of said connectors being in communication with one of said computing nodes.

43. A modular multinode computing apparatus, comprising:

a rack mountable enclosure;

more than one system board secured within said enclosure in a high density configuration, each of said system boards constituting a separate computing node; and connecting means provided on said enclosure for accessing said computing nodes, and wherein said connecting means comprises a common connector for accessing more than one of said system boards and switching means for associating said connector with a selected one of said system boards.

44. A modular multinode computing apparatus, comprising:

a rack mountable enclosure;

more than one computing node secured within said enclosure in a high density configuration; and connecting means provided on said enclosure for accessing said computing nodes, said connecting means comprising a common connector for accessing more than one of said computing nodes and switching means for associating said connector with a selected one of said computing nodes.

* * * * *